United States Patent [19]
Enzlin et al.

[11] 3,977,020
[45] Aug. 24, 1976

[54] SEMICONDUCTOR DEVICE, METHOD OF MANUFACTURING SAME AND CIRCUIT ARRANGEMENT COMPRISING THE DEVICE

[75] Inventors: Theodoor Henri Enzlin; Walter Henricus Maria Magdala Smulders, both of Nijmegen, Netherlands

[73] Assignee: U.S. Philips Corporation, New York, N.Y.

[22] Filed: Aug. 29, 1974

[21] Appl. No.: 501,677

[30] Foreign Application Priority Data
Sept. 12, 1973 Netherlands................. 7312547

[52] U.S. Cl. .................................. 357/51; 357/55; 357/36
[51] Int. Cl.² ................. H01L 27/02; H01L 29/06
[58] Field of Search ............... 357/13, 51, 46, 55, 357/36

[56] References Cited
UNITED STATES PATENTS
3,751,726   8/1973   Einthoven .................. 317/235 R Primary Examiner—Martin H. Edlow
Attorney, Agent, or Firm—Frank R. Trifari; Leon Nigohosian

[57] ABSTRACT

A semiconductor device having a transistor, in particular a power transistor, of the planar type which comprises a distributed base-series resistor for safety against second breakdown. According to the invention the base resistor is formed in that a resistance-increasing region which is present beyond the emitter zone and substantially entirely surrounds the inner contact surface is present in the base zone between the contact surfaces of the emitter and base electrode layers surrounding each other along substantially the whole edge of the emitter-base junction.

14 Claims, 10 Drawing Figures

SEMICONDUCTOR DEVICE, METHOD OF MANUFACTURING SAME AND CIRCUIT ARRANGEMENT COMPRISING THE DEVICE

BACKGROUND OF THE INVENTION

The invention relates to a semiconductor device comprising a wafer-shaped semiconductor body having a surface which is at least partly covered with an electrically insulating layer and comprising at least a transistor having at least a base zone of a first conductivity type which adjoins the said surface, a collector zone of the second conductivity type which adjoins the base zone and constitutes a collector-base junction with the base zone, and likewise surface-adjoining emitter zone of the second conductivity type. The emitter zone and base zone form an emitter-base junction terminating at the surface, the emitter zone and the base zone each having an electrode layer which adjoins the relevant zone within a contact surface. The device further includes a first electrode layer and the associated first contact surface surrounding the other, second electrode layer substantially entirely, with, at most, electrode layers which are connected to the semiconductor surface being present above the part of the semiconductor surface between the inner edge of the first contact surface and the oppositely located edge of the second contact surface associated with to the second electrode layer.

The invention also relates to a very advantageous method of manufacturing a device according to the invention and to a circuit arrangement which comprises such a device.

It is known that in bipolar transitors (and this is of course of particular importance for power transistors which are operated at high currents and voltages) a phenomenon may occur which is known as second breakdown. In certain circumstances, current concentration in certain regions of the emitter and/or the base zone occurs which may result in local overheating and irreparable damage.

Several measures have already been proposed to check the phenomenon of second breaKdown and, if possible, to avoid it entirely. The object of all these measures is that the current which passes through the emitter-base junction is not restricted to only a small part of the total emitter region or the total base region, but will distribute uniformly over the whole emitter-base junction.

The best known of said measures consists in providing a distributed series resistor between the emitter connection and the emitter-base junction, in which a part of the emitter zone which locally draws too much current comes to a lower emitter-base voltage as a result of the distributed series resistor and will hence take part in the injection to a smaller extent. In many power transistors the emitter is subdivided into partial zones in which case each of said partial zones must be provided with a series resistor so as to obtain the said effect of a distributed emitter-series resistor.

Instead of, or besides, using a distributed emitter-series resistor, second breakdown may also be prevented, or at least the danger thereof can be reduced, by using a distributed base-series resistor between the base electrode layer and the emitter-base junction. Generally such a base-series resistor, however, will be less effective, that is to say, it will have to have a higher value than a corresponding emitter-series resistor, since the base current is only a fraction of the total emitter current and, in order to obtain an effective effect across the base resistor, it will be necessary to obtain a voltage drop of the same order of magnitude as across a comparable emitter-series resistor. The manufacture of an effective divided base resistor of comparatively high resistance meets with several technological and geometrical difficulties.

On the other hand, it will, in certain circumstances, nevertheless be preferred to use a distributed base-series resistor instead of a distributed emitter-series resistor. This is the case, for example, when the transistor is incorporated in a so-called common emitter circuit in which the emitter zone is set up at a fixed reference potential, for example earth.

One of the objects of the present invention is to provide a construction for a semiconductor device having a transistor with incporated divided base resistor which can be manufactured in a very simple manner and moreover shows electrically important advantages.

BRIEF SUMMARY OF THE INVENTION

The invention is, inter alia, based on the recognition of the fact that such a base resistor can be integrated in a very simple manner and that by a specific construction of the base resistor, the number of extra process steps necessary for the manufacture thereof can be minimized and for certain embodiments may even be zero.

The invention is furthermore based on the recognition that, in contrast with a distributed emitter-series resistor, a distributed base-series resistor of efficient construction may be dependent upon current and voltage in a manner which influences the results in a favourable way.

A semiconductor device of the type described in the preamble is therefore characterized according to the invention in that at least a region which is separated from the emitter zone by a part of the base zone, surrounds the second contact surface substantially entirely, increases the resistance of the base zone and forms a distributed base resistor, is present in the said part of the semiconductor surface along substantially the whole edge of the emitter-base junction.

BRIEF DESCRIPTION OF THE DRAWINGS

The invention will now be described in greater detail with reference to a few embodiments and the drawings, in which.

Figure 1:
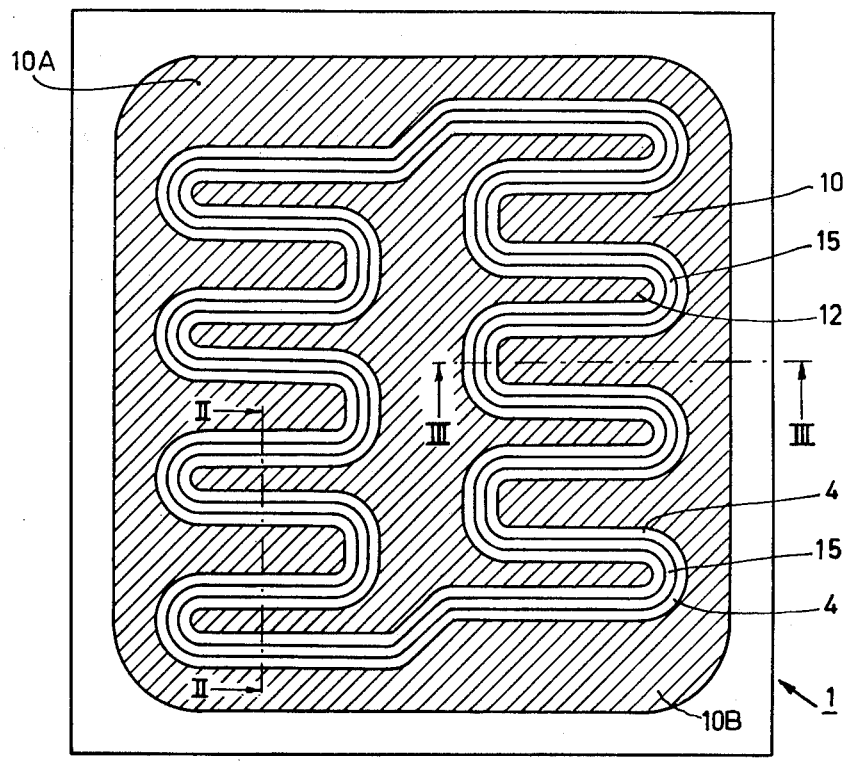
FIG. 1 is a diagrammatic plan view of a semiconductor device according to the invention.

The figures are diagrammatic and not drawn to scale in which in the cross-sectional views particularly the dimensions in the direction of thickness are strongly exaggerated and not shown mutually in the correct proportion for reasons of clarity.

Corresponding parts in the drawings are generally referred to by the same reference numerals. In the plan views metal layers are shaded. In the cross-sectional views semiconductor zones having the same direction of shading are of the same conductivity type. Insulating layers on the surface are shown to be equally thick everywhere for reasons of clarity although this need by no means be the case actually.

PREFERRED EMBODIMENTS

The base resistor according to the invention has an unusual shape. Actually, upon providing an arbitrary integrated base resistor, the resistor will generally not be provided along the whole emitter-base junction since such a geometry gives rise to a comparatively low base resistor which in proportion to its value occupies a comparatively large surface area.

It has suprisingly been found, however, that such an unusual structure of the base resistor reduces the danger of second breakdown considerably since the structure according to the invention provides a distributed base resistor so that a homogeneous distribution of the current between the emitter-base junction can be obtained in contrast with known devices having locally provided integrated base resistors.

It important that the region which forms the base resistor be separated from the emitter zone by a part of the base zone. A continuation of the said region up to the emitter zone may actually result in the current amplification of the transistor being influenced in an undesired manner.

The formed base resistor may be of substantially equal size between two oppositely located edge parts of the same length of the emitter contact surface and the base contact surface. In certain circumstances, however, it may be of advantage, for example, to obtain a desired inhomogeneous dissipation distribution, to give the distributed base resistor a different value in several places between the emitter and base contact surface (which could be done, for example, by varying the width of the insulating zone, or strip-like high-ohmic base zone, to be described hereinafter). As a result of this, and dependent upon the cooling used, the crystal can obtain a more uniform temperature.

In the device according to the invention a distributed base-series resistor is incorporated in the base zone itself so that a very simple integration is obtained without using separate resistors which are separated in the semi-conductor body from the transistor. As a result of this, not only a space saving is achieved but the structure according to the invention can also be manufactured in a simple manner as will be described in detail hereinafter.

According to the invention, the base resistor can be formed in various manners. According to a preferred embodiment the base resistor is formed by a part of the base zone in which an insulating zone separated from the emitter zone by a further part of the base zone is provided and extends between the emitter and base contact surfaces over only a part of the thickness of the base zone. The insulating zone itself may consist of electrically insulating material or of non-insulating material which is separated electrically from the adjoining part of the base zone by a barrier (for example, a p-n junction or a Schottky barrier). Insulating zone is therefore to be understood to mean in the sense of the invention generally a zone through which no base current can flow.

The base resistor obtained in this manner may be modulated by the emitter current. At a higher emitter current a larger number of charge carriers are injected in the part of the base zone which forms the base resistor, so that the base resistor becomes lower at higher emitter current, and conversely. This decreases the variation in the voltage drop across the base resistor with varying emitter current, so that the emitter-base voltage does not become unnecessarily large at high currents.

An insulating zone as meant above can be formed in various manners. In a very simple manner the insulating zone (e.g., FIG. 6) can be formed fully or partly by a groove in the base zone.

Figure 7:
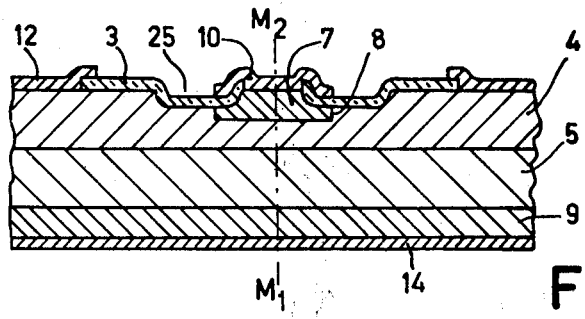
FIGS. 7 and 8 are diagrammatic cross-sectional views through further embodiments of the invention.

The groove may or may not be filled with insulating material (e.g., FIG. 7). In many cases, however, the groove will preferably be filled fully or partly with electrically insulating material, for example, with silicon oxide, which may extend, if desired, up to or above the original surface so that the groove is fully filled. Such a structure may be obtained, for example, by using local oxidation as is described inter alia by Appels et al, Philips Research Reports, April, 1970, pp. 118–132.

According to another preferred embodiment the insulating zone may comprise a semiconductor zone of the second conductivity type which is fully surrounded within the semiconductor body by the base zone and from a p-n junction therewith (e.g., FIGS. 1–5). The p-n junction and the associated depletion zone form a barrier for the base current and in this manner, for example, a "buried" distributed base resistor may be obtained. This preferred embodiment has the important advantage over the use of a groove that the provision of a groove of accurate dimensions, for example by etching, often is technologically difficult, whereas, on the contrary, a semiconductor zone of a conductivity type opposite to that of the base zone can easily be provided with great accuracy, for example, by diffusion, by ion implantation, by local epitaxial growth, or differently.

Although the insulating zone may extend deeper or less deep than the emitter zone, it has been found that a base resistor of the desired size can in many cases be obtained when the insulating zone extends from the surface over a depth which is substantially equal to the thickness of the emitter zone. Said preferred embodiment is of importance in particular in the case in which the insulating zone is a semiconductor zone of the second conductivity type, since the insulating zone in that case can be provided simultaneously with the emitter zone via the same mask.

The base resistors obtained by using an insulation zone depend upon the collector-base voltage since by expansion of the depletion zone in the base the resistance will be higher at higher collector-base voltage, which is favourable for the end in view.

In all these cases in which the distributed base resistor is formed by means of an insulating zone it is to be prevented that the part of the base zone which is present between the insulating zone and the collector-base junction is cut off by the depletion zone of the collector-base junction, since otherwise the transistor action stops in that the base connection is no longer connected electrically to the active part of the base zone adjoining the emitter zone. In order to prevent such a cut off, according to an important preferred embodiment the base zone comprises a first region of lower doping adjoining the collector zone and a second region of higher doping adjoining the surface and the emitter zone, the insulating zone extending from the surface over only a part of the thickness of the second region (e.g., FIGS. 5–10). Due to the higher doping of the second region adjoining the insulating zone, the depletion zone does not penetrate to the insulating zone even at comparatively high collector-base voltages.

Figure 9:
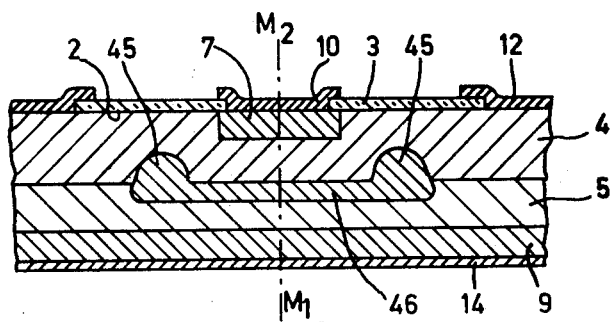
FIGS. 9 and 10 are diagrammatic cross-sectional views through further embodiments of the invention.
Figure 10:
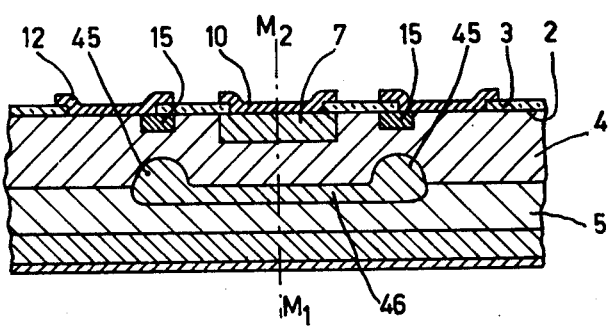

Instead of from the surface, the insulating zone may also extend, from the side of the collector zone in the base zone and be formed, for example, by a part of the collector zone which locally extends further in the base zone than along the remaining part of the collector-base junction (e.g., FIGS. 9, 10). A combination thereof with an insulating zone which extends from the surface is also possible e.g., FIG. 10. However, such structures generally require at least one extra masking step. The insulating zone therefore preferably extends from the surface.

Instead of by using an insulating zone, the distributed base resistor according to the invention may also be obtained differently. For example, an important further preferred embodiment according to the invention is characterized in that the base zone comprises a first region of lower doping which adjoins the collector zone at least locally and a second region of higher doping which adjoins the surface and the emitter zone and on which the base electrode layer is present, and that the base resistor comprises a strip-shaped part of the first region which extends between the emitter and base contact surfaces from the collector-base junction through the second region in the direction of the surface and is separated from the emitter zone by the second region. In this strip-shaped part of the base zone, which, if desired may extend up to the surface, the depletion zone may extend much further than in the more highly doped part of the base zone so that between said depletion zone and the surface a base resistor is formed which can be influenced by the collector-base voltage.

The emitter electrode layer may be surrounded by the base electrode layer, or conversely. In power transistors for which the invention is of particular interest, the base and emitter electrode layers usually form an interdigital system. In connection herewith, an important preferred embodiment is characterized in that the base and emitter electrode layers interdigitate, the base resistor extending according to a serpentine line between the base and emitter contact surfaces.

A particularly advantageous method of manufacturing the device according to the invention in which the distributed base resistor is realized by means of an insulating zone is characterized in that the emitter zone and the insulating zone are provided simultaneously while using the same mask by introduction of the second conductivity type determining doping atoms (for example, by diffusion or by ion implantation) in the body. In this manner a base resistor according to the invention may be provided without any extra process step, only by arranging a small change in the mask. The base zone may be provided either before, or (for example, by ion implantation) after the emitter zone.

Finally the invention relates to a circuit arrangement comprising a semiconductor device according to the invention in which the emitter zone of the transistor is at a fixed reference potential, the input signal is supplied to the base and the output signal is derived from the collector. In such a common (for example grounded) emitter arrangement an emitter-series resistor is less desired since upon use hereof between the emitter and the fixed reference potential a voltage drop is set up across the emitter resistor which moreover depends upon the emitter current so that the (minimum) voltage between the collector and the reference potential is increased. In such a circuit arrangement the use of a base-series resistor according to the invention is thus of particular importance.

Figure 2:
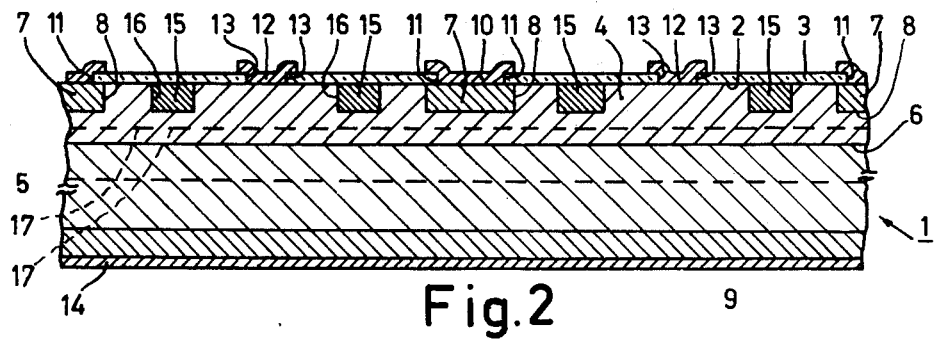
FIG. 2 is a diagrammatic cross-sectional view through a part of the device shown in FIG. 1 taken on the line II—II.
Figure 3:
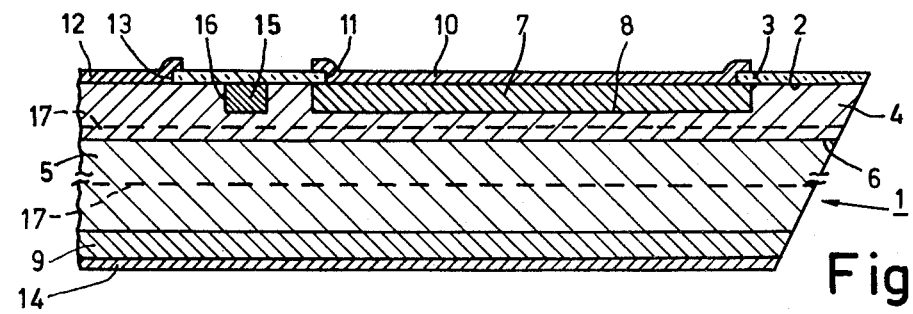
FIG. 3 is a diagrammatic cross-sectional view through a part of the device shown in FIG. 1 taken on the line III—III.

FIG. 1 is a diagrammatic plan view and FIGS. 2 and 3 are diagrammatic cross-sectional views taken on the lines II—II and III—III of FIG. 1 of a semiconductor device according to the invention. The device comprises a wafer-shaped semiconductor body 1 having a surface 2 which is covered with an electrically insulating layer 3 of silicon oxide. The device comprises a bipolar transistor having a $p$-type conductive base zone 4 which adjoins the surface 2, an $n$-type conductive collector zone 5 which adjoins said base zone and which forms a collector-base junction 6 with the base zone 4, and an n-type conductive emitter zone 7 which also adjoins the surface 2 and which forms an emitter-base junction 8 with the base zone 4 terminating at the surface 2. The collector zone 5 has a resistivity of approximately 45 ohm.cm, a thickness of approximately 65 microns and has on its lower side a more highly doped, for example, diffused $n$-type contact layer 9 of an average resistivity of, for example, approximately 0.01 ohm.cm and a thickness of, for example, 80 microns. The base zone 4, in this example a diffused zone, has a thickness of approximately 25 microns taken from the surface 2, and a surface concentration of approximately $10^{19}$ boron atoms per ccm; the emitter zone has a thickness of approximately 10 microns and has been obtained in this example by diffusion, for example, a phosphorus diffusion. The said thickness and dopings are by no means critical and may be varied within wide limits.

The emitter zone 7 has an aluminium electrode layer 10 which adjoins the emitter zone 7 within the emitter-contact surface whose inner edge is denoted by 11. The base zone 4 has an aluminium electrode layer 12 which adjoins the base zone 4 within the base contact surface whose edge is denoted by 13. In this example the base electrode layer 12 and associated base contact surface are surrounded by the emitter electrode layer 10 and the emitter contact surface. However, this need not be the case and, as will become apparent from following Examples, the emitter electrode layer, for example, may be surrounded by the base electrode layer in other embodiments. Above the part of the base zone 4 which is present between the inner edge 11 of the emitter contact surface and the opposite located edge 13 of the base contact surface there are no further electrode layers which are not connected to the semiconductor surface 2 except the electrode layers 10 and 12 connected to the emitter zone 7 and the base zone 4, respectively. The base and emitter electrode layers interdigitate. The edge of the semiconductor plate is bevelled in known manner at an angle of approximately 60° so as to increase the breakdown voltage of the base-collector junction 6. A collector electrode layer 14 is provided on the layer 9; connection conductors are provided on the electrode layers 10, 12 and 14 in the usual manner but are not shown in the Figures; in the power transistor of this Example, two parallel emitter connections are provided on the widened parts 10A and B of the electrode layer 10. The comb-shaped electrode layers 10 and 12 in practice usually comprise more teeth; for clarity, only a few of them are shown in the Figure.

Power transistors of the above-described type are known. However, one of their drawbacks is that at certain voltages and currents, current concentrations occur notably at the emitter-base junction so that the transistor is damaged beyond repair. This phenomenon, known as second breakdown, is usually counteracted in practice by using a divided emitter series resistor in which preferably each emitter digit has a separate series resistor which restricts the emitter current at the area in the case of current concentration in such area of the emitter.

In certain circumstances, however, the use of such emitter series resistors may be undesired and the use of a base resistor is to be preferred. For that purpose, however, the provision as such of an integrated or nonintegrated base resistor is not sufficient. Actually, such a base resistor is generally provided only locally and in such manner that the resistors between the base electrode layer and various places of the emitter-base junction show so large differences that the current distribution over the emitter-base junction is not or only slightly improved by it.

According to the invention, however, a distributed base resistor is formed in that in the part of the base zone 4 between the inner edge 11 of the emitter contact surface and the oppositely located edge 13 of the base contact surface a region 15 which is separated from the emitter zone 7 by a part of the base zone 4 is present along substantially the whole edge of the emitter-base junction 8 and surrounds the base contact surface substantially entirely and increases the resistance of the base zone 4. In the embodiment shown in FIGS. 1 to 3 the region 15 is formed by a diffused n-type insulating zone 15 which extends from the surface 2 in the base zone 4 over only a part of the thickness thereof. Within the semiconductor body the zone 15 is entirely surrounded by the base zone 4 and forms a p-n junction 16 therewith so that no base current can flow through the zone 15. As a result of this a buried resistor formed by the part of the base zone 4 present between the collector zone 5 and the insulating zone 15, is present everywhere between the base contact surface and the emitter-base junction 8. The zone 15 in this embodiment is not contacted and extends according to a serpentine line between the interdigitating base and emitter contact surfaces.

In the embodiment described the base resistor between oppositely located parts of the contact surface edges 11 and 13 is substantially equal everywhere. If it be desired in certain circumstances, however, the width of the zig-zag zone 15, for example, may vary so as to obtain accurately controllable dissipation differences over the surface of the semiconductor plate, which, in combination with the cooling used in the relevant case, may result in a more homogeneous temperature of the crystal.

The width of the zone 15 in this embodiment is 50 microns, the distances between the zone 15 and the emimtter and base contact surfaces are each 40 microns.

The thickness of the zone 15 in this embodiment is also 10 microns, which yields a readily useful value of the base resistor and moreover has the advantage that the zone 15 can be obtained simultaneously with the emitter zone 7 while using the same masking and diffusion step.

An important advantage of the buried resistor according to the invention is that the resistance becomes smaller at a higher emitter current by conductivity modulation of the base region below the zone 15 as a result of electron injection from the emitter zone 7. This prevents too high a voltage drop across the base resistor. Moreover, the base resistance increases when the collector-base voltage increases since the depletion zone of the collector-base junction, the boundaries 17, of which are shown diagrammatically in broken lines in FIGS. 2 and 3 extends farther in the base zone 4 at higher collector-base voltage. This has a favourable influence on the safety of the device against a second breakdown.

The device according to the embodiment described may be manufactured by using methods conventionally used in semiconductor technology. For example, starting material may be an approximately 300 microns thick n-type silicon plate, resistivity approximately 45 ohm. cm, in which an n-type contact zone 9, 80 microns thick, is formed by using a phosphorus diffusion. After removing said layer from one surface and removing material so as to obtain the desired thickness of the plate, the base zone 4 is obtained in said surface (2) by a boron diffusion. The layer 3 is then provided by oxidation after which the emitter zone and the insulating zone 15 are obtained while using known photolithographic etching methods and while using one mask in the same diffusion step.

Other doping methods to obtain the various semiconductor zones, for example ion implantation, may also be used instead of diffusion. When implantation is used to obtain the base zone, the base zone 4 may be provided both prior to and after the emitter zone 7 by implantation of, for example, boron ions through the already provided emitter zone 7, at least when the emitter and base thicknesses permit this.

Finally, the electrode layers are provided in known manner, for example, by vapour deposition and etching, and the device is further assembled and provided with a suitable envelope.

Instead of an insulating semiconductor zone, the distributed base resistor according to the invention may also be provided in many other manners. For illustration, FIGS. 4 to 9 show several of such other embodiments. For simplicity, all said devices are rotationally symmetric around the line $M_1$-$M_2$, although the indicated possibilities will usuaally be used with quite different geometries of the device, for example, as those shown in FIGS. 1 to 3.

Figure 4:
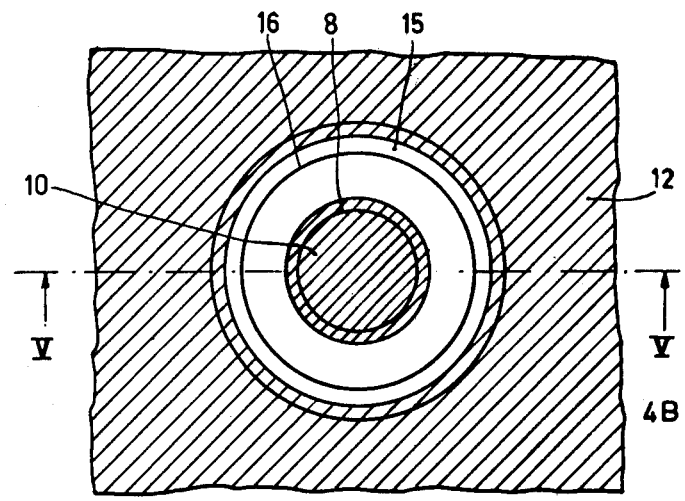
FIG. 4 is a diagrammatic plan view of another device according to the invention.
Figure 5:
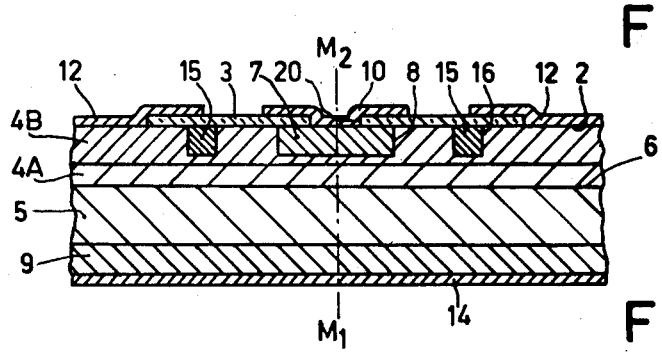
FIG. 5 is a diagrammatic cross-sectional view taken on the line V—V of the device shown in FIG. 4.

FIG. 4 is a diagrammatic plan view and FIG. 5 a diagrammatic cross-sectional view taken in the line V—V of FIG. 4 of another device according to the invention. The device differs from the transistor described above. inter alia in that in this case the base electrode layer 12 and the base contact surface surround the emitter electrode layer 10. Furthermore, in this embodiment the base electrode layer 12 overlaps the insulating n-type zone 15 partly and the emitter electrode layer 10 also overlaps the emitter-base junctioin 8 to stabilize said junction. The most important difference between this device and the preceding device shown in FIGS. 1 to 3, however, resides in the fact that the p-type base zone 4 comprises a first region 4A which adjoints the n-type collector zone 5 has a comparatively low doping of approximately 30 ohm.cm and a second region 4B which adjoins the surface 2 and the n-type emitter zone 7 and has a higher doping, the insulating zone 15 extending from the surface 2 over only a part of the thickness of the second region 4B. The first base region 4A in this embodiment is formed by a epitaxial p-type silicon layer, and the second base region 4B by a p-type layer which is diffused in said epitaxial layer and has a surface doping of $10^{19}$ boron atoms per ccm. The part of the more highly doped layer 4B which is present between the zone 15 and the layer 4A serves to prevent the depletion zone of the collector-base junction 6 reaching the zone 15.

The operation of the device shown in FIGS. 4 and 5 is otherwise the same as that of the device shown in FIGS. 1 to 3, while the method of manufacturing may also be the same for the greater part.

A very good safety against second breakdown can be obtained if, in addition to the distributed base resistor according to the invention, a distributed emitter-series resistor is also present. For illustration, FIG. 5 shows a built-in emitter-series resistor in this embodiment has been obtained by providing the edge 20 of the emitter-contact surface at a comparatively large distance from the line of intersection of the emitter-base junction 8 with the surface 2. As a result of this, a part of the emitter zone 7 forms a lateral emitter-series resistor.

Figure 6:
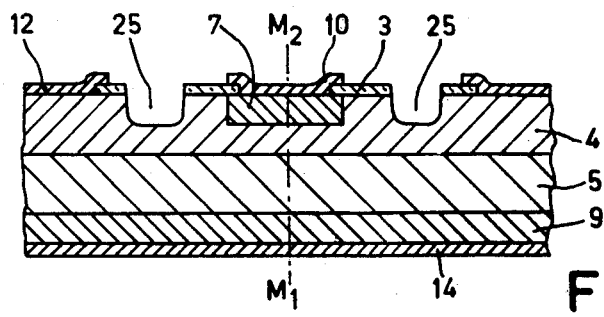
FIG. 6 is a diagrammatic cross-sectional view through a further device according to the invention.

FIG. 6 is a diagrammatic cross-sectional view of an embodiment in which the insulating zone, instead of being by a semiconductor zone having a conductivity type opposite to that of the base zone, is formed by a groove 25. This groove fullfills the same function as the semiconductor zone 15 and preferably also has the same depth as the emitter zone 7. The lateral dimensions of the groove, may, for example, be the same as those of the zone 15 in FIGS. 1 to 3, in which the zone 15 might be replaced by a groove 25. The provision of a groove 25, for example by etching, however, usually is considerably more difficult to carry out with the required accuracy than the provision of an insulating semiconductor zone 15 as in the preceding embodiments.

Figure 8:
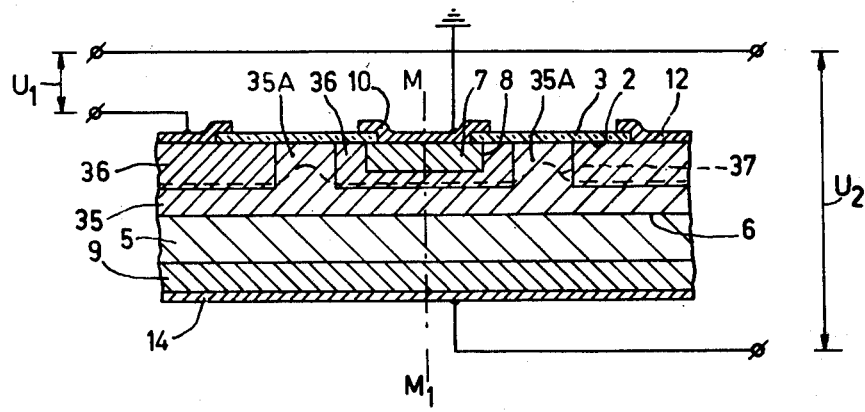

A quite different embodiment according to the invention is shown in FIG. 8. In this embodiment the base zone comprises a first p-type region 35, for example an epitaxial layer, of lower doping, for example, with a resistivity of 40 ohm.cm, which adjoins the n-type collector zone 5, and a second p-type region 36 of higher doping, for example a diffused layer with a surface doping of $10^{19}$ boron atoms per ccm which adjoins the surface 2 and the emitter zone 7 and on which the base electrode 12 is present. Instead of a groove or an n-type insulating semiconductor zone, the base resistor in this case comprises a strip-shaped paprt 35A of the first region 35, which part 35A extends between the emitter and the base contact surfaces from the collector-base junction 6 up to the surface 2. In this structure the depletion zone of the collector-base junction 6 the boundary of which is shown in broken lines (37), in the operating condition extends within the strip-shaped part 35A considerably farther towards the surface 2 than elsewhere and thus forms a distributed base resistor between the base contact surface and the emitter-base junction 8 to be modulated by the collector-base voltage.

Although in FIG. 7 the region 36 extends only over a part of the overall thickness of the base zone (35, 36), the region 36 may extend, if desired, up to the collector-base junction 6 and enclose an annular, low-doped region 35A. The region 35A need not extend up to the surface 2 but, if necessary, may be separated entirely or partly from the highly doped region 36 of the surface 2 by a very thin layer-shaped part.

FIGS. 9 and 10 finally give examples of devices according to the invention in which the distributed base resistor is formed entirely or partly by a bulge 45 of the collector zone in the direction of the surface 2. In practice this has the same result as the zone 15 of FIGS. 1 to 5 but usually is more difficult to realise technologically. In the embodiments shown in FIGS. 9 and 10 this has been done, for example, by using an n-type buried layer consisting of a part 46 doped with a slowly diffusing donor of, for example, arsenic, below the emitter 7, and an edge part 45 having a more rapidly diffusing donor, for example, phosphorus. During the growth of the base zone, in this case a p-type epitaxial layer 4, the parts 45 and 46 are formed by diffusion. In the embodiment shown in FIG. 10 the bulge 45 is combined with an n-type zone 15 in which extends from the surface 2 and, if desired, may be replaced by a groove, for example, the groove 25 of FIG. 6. Moreover, in contrast with the preceding embodiments, the zone 15 of FIG. 10 is short-circuited with the base by the base electrode layer 12. In the examples of FIGS. 1 to 5 this may also be done and, by a rapid draining of stored charge, may increase the switching speed of the transistor although generally at the expense of some reduction of the gain.

For illustration, FIG. 7 shows diagrammatically how said transistor can advantageously be incorporated in a common emitter arrangement in which the emitter zone 7 is at a fixed reference potential, in this embodiment earth, while the input signal $U_1$ is supplied to the base and the output signal $U_2$ is derived from the collector. As said above, the invention is of particular interest in transistors which are incorporated in such an arrangement.

In the embodiment described the emitter electrode layer surrounds the base electrode layer entirely (FIGS. 1 to 3) or conversely (FIGS. 4 to 9). In certain circumstances, however, it may be desirable to provide an interruption in the outer electrode layer, for example, to convey a conductive layer across the insulating layer 3 to the inner electrode layer. This may be of importance in particular when the semiconductor device according to the invention is no discrete transistor but is constructed in the form of a monolithic integrated circuit of which the transistor forms part. Several of the described transistors may also be integrated in one crystal, either arranged in parallel to increase the power, or combined to form a circuit, for example, a Darlington circuit.

It will be obvious that the invention is not restricted to the embodiments described but that many variations are possible to those skilled in the art without departing from the scope of this invention. For example, semiconductor materials other than silicon may be used. Instead of silicon oxide grown thermally or non-thermally, another material may also be used as an insulating layer, for example, silicon nitride, aluminium oxide or a glass layer, or a composite layer of layers of different compositions lying one on top of the other. The composition and the thickness of the insulating layer need not be the same either throughout the semiconductor plate.

The conductivity types of the semiconductor zones of each embodiment may (all simultaneously) be replaced by their opposite types. Furthermore, the geometry of the device may be varied within wide limits provided the essential conditions of the invention be satisfied. Besides by diffusion or ion implantation, the zone 15 may also be obtained, for example, by first etching a groove, for example, groove 25 (FIG. 6) and growing therein epitaxially a zone of the desired conductivity type.

Instead of on the side of the crystal the base collector junction may also terminate at the surface 2 and the transistor may comprise more than one of such planar base zones. The emitter zone need not form one coherent region but may consist of several sub-zones which are electrically connected together (emitted digits).

Finally it is to be noted that, although the in embodiments only one region is present between the emitter and base contact surfaces in the base zone to form the distributed base resistor, several of said regions might also be used, if desired. For example, several zones 15 or grooves 25 or combinations thereof may be formed in which, viewed from the said second electrode layer, each further zone or groove surrounds the preceding one substantially entirely. It is of importance, that the said regions are separated from the emitter zone by a part of the base zone as to prevent undesired influencing of the emitter efficiency and for decrease of the emitter-base breakdown voltage.

What is claimed is:

1. A semiconductor device comprising:
   a. a wafer-shaped semiconductor body having a first surface;
   b. an electrically insulating layer which at least partly covers said first surface;
   c. at least a transistor that is located in said body and has at least a base zone of a first conductivity type which adjoins the said first surface, a collector zone of a second conductivity type which adjoins said base zone and forms therewith a collector-base junction, and an emitter zone of said second conductivity type that adjoins said first surface and with said base zone forms an emitter-base junction, said emitter-base junction terminating at said first surface, said emitter zone and said base zone respectively comprising emitter and base contact surfaces;
   d. emitter and base electrode layers respectively disposed at said emitter and base contact surfaces and adjoining their associated said zones, a first said electrode layer and its associated said contact surface substantially entirely surrounding the other one of said electrode layers, a part of said first surface being located between the inner edge of one of said contact surfaces and the oppositely located edge of other said contact surface that is associated with the second said electrode layer, there being present above said first surface part at most electrode layers which are connected to the semiconductor surface; and
   e. at least a further region which substantially entirely surrounds said other contact surface and is separated from said emitter zone by a part of said base zone, said further zone being without any direct electrical connection and forming a distributed base resistor, said further zone being disposed in said base zone at said part of said semiconductor surface along substantially the whole length of the emitter-base junction.

2. A semiconductor device as in claim 1, wherein there is the width of said further region varies between said emitter contact surface and the base contact surface.

3. A semiconductor device as in claim 1, wherein said further region comprises a part of said base zone comprising an insulating zone which is separated from the emitter zone by a further part of said base zone and is located between said emitter and base contact surfaces over only a part of the thickness of said base zone.

4. A semiconductor device as in claiam 3, wherein said insulating zone extends from said first surface into said base zone.

5. A semiconductor device as in claim 4, wherein said insulating zone comprises a groove in said base zone.

6. A semiconductor device as in claim 5, wherein said groove is filled at least partly with an electrically insulating material.

7. A semiconductor device as in claim 3, wherein said insulating zone comprises a semiconductor zone of said second conductivity type which is fully surrounded within said body by said base zone and forms a p-n junctiotn therewith.

8. A semiconductor device as in claim 3, wherein said insulating zone extends from said first surface over a depth which is substantially equal to the thickness of said emitter zone.

9. A semiconductor device as in claim 3, wherein said base zone comprises a lower doping impurity level, first region that adjoins said collector zone and a higher doping impurity level, second region that adjoins said first surface and the emitter zone, said insulating zone extending from said first surface over only a part of the thickness of said second region.

10. A semiconductor device as in claim 1, wherein said base zone comprises a first region of lower doping impurity level which adjoins the collector zone at least locally, a second region of higher doping impurity level which adjoins said first surface and said emitter zone, said base electrode layer being present on said second region, said base resistor comprising a strip-shaped part of said first region, wherein said strip-shaped part extends between said emitter and base contact surfaces from the collector-base junction through said second region in the direction of said first surface and is separated from said emitter zone by said second region.

11. A semiconductor device as in claim 1, wherein said base and emitter electrode layers are interdigitated, said base resistor extending in serpentine form between said base and emitter contact surfaces.

12. A semiconductor device as in claim 1, wherein said further region which comprises said distributed base resistor comprises a part of said base zone into which a bulge of said collector zone extends.

13. A method of manufacturing a semiconductor device as in claim 8, comprising the step of simultaneously forming said emitter zone and said insulating zone with the same mask and introducing doping impurity atoms in said body.

14. A circuit arrangement comprising a semiconductor device as in claim 1, wherein said emitter zone of said transistor is at a fixed reference potential, the input signal is supplied to said base, and the outer signal is derived from said collector.

* * * * *